(12) United States Patent
Ide et al.

(10) Patent No.: US 6,877,911 B2
(45) Date of Patent: Apr. 12, 2005

(54) OPTICAL-FIBER SUPPORTING MEMBER AND OPTICAL TRANSMISSION DEVICE USING THE SAME

(75) Inventors: Tsugio Ide, Fujimi-machi (JP); Shojiro Kitamura, Fujimi-machi (JP); Atsushi Harada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 240 days.

(21) Appl. No.: 10/114,983

(22) Filed: Apr. 4, 2002

(65) Prior Publication Data

US 2002/0159719 A1 Oct. 31, 2002

(30) Foreign Application Priority Data

Apr. 13, 2001 (JP) ........................................ 2001-115960

(51) Int. Cl.[7] ................................................. G02B 6/36
(52) U.S. Cl. ............................ 385/88; 385/89; 385/90; 385/91; 385/92
(58) Field of Search ............................. 385/88, 89, 90, 385/91, 92

(56) References Cited

U.S. PATENT DOCUMENTS 5,904,545 A  5/1999  Smith et al.
6,243,508 B1 * 6/2001 Jewell et al. ................. 385/14

FOREIGN PATENT DOCUMENTS

| JP | 63239890 A | * 10/1988 |
| JP | A-10-148734 | 6/1998 |
| JP | A-11-505630 | 5/1999 |
| WO | WO 97/33390 | 9/1997 |

* cited by examiner

Primary Examiner—John R. Lee
Assistant Examiner—Paul M. Gurzo
(74) Attorney, Agent, or Firm—Oliff & Berridge, PLC (57) ABSTRACT

In a optical transmission device in which a surface-emitting laser and an optical fiber are coupled, a light emitting portion of the surface-emitting laser and an input end of the optical fiber are positioned with high precision. An optical-fiber supporting member is provided with an optical-fiber through hole in which an end portion of an optical fiber is inserted, and a photodiode. The through hole and the photodiode are arranged corresponding to the arrangement of two light emitting portions of a surface-emitting laser so that a center of the circular section of the through hole and the optical axis of the optical-transmission light emitting portion are off set by a predetermined amount when a center point of the photodiode and the optical axis of the reference-light emitting portion are aligned. The surface-emitting laser and the optical-fiber supporting member are coupled with the center point of the photodiode and the optical axis of the reference-light emitting portion aligned with each other.

6 Claims, 6 Drawing Sheets

OPTICAL-FIBER SUPPORTING MEMBER AND OPTICAL TRANSMISSION DEVICE USING THE SAME

BACKGROUND OF THE INVENTION

1. Field of Invention

The present invention relates to an optical transmission device in which a light emitting element and an optical fiber are coupled, and more particularly, to an optical transmission device that can achieve long-distance and high-speed optical transmission using a light emitting element having a light emitting surface that is parallel to a substrate surface.

2. Description of Related Art

Research has recently been conducted to replace conventional edge-emitting lasers with surface-emitting lasers as light emitting elements of optical transmission devices. Since the laser radiation angle of the surface-emitting lasers is small, even when laser light directly enters an optical fiber, not via a focusing lens, optical coupling can be performed with a relatively high efficiency.

A method for optically coupling a surface-emitting laser to an optical fiber without using a lens is disclosed in, for example, Japanese Unexamined Patent Application Publication No. 10-148734. In the method of this publication, an optical-fiber fixing hole is formed in a block member, an optical fiber is positioned in the hole of the block member by being inserted therein from one aperture, and a surface-emitting laser is fixed to a surface of the block member at the side of the other aperture. In this method, however, since the positioning accuracy depends on the machining accuracy of the block member, high-precision positioning is impossible.

For this reason, when a surface-emitting laser is optically coupled to an optical fiber without using a lens, a multimode optical fiber (an optical fiber having a core diameter of more than 10 $\mu$m) has been used instead of a single-mode optical fiber having a small core diameter that needs to be precisely positioned (the core diameter is 10 $\mu$m or less).

On the other hand, in an optical transmission device using an optical fiber, a single-mode optical fiber is used for long-distance and high-speed optical transmission. It has been assumed that a multimode optical fiber cannot achieve long-distance and high-speed optical transmission because its transmission band is narrow.

In contrast, PCT Japanese Translation Patent Publication No. 11-505630 discloses that even a multimode optical fiber can perform optical transmission with a transmission characteristic similar to that of a single-mode optical fiber by making laser light from a surface-emitting laser enter the optical fiber so as to be offset from the optical axis (hereinafter "offset launch").

In order to implement the offset launch, it is necessary to set the offset amount within a suitable range so as to increase the transmission band and to decrease the coupling loss. In a positioning method in which the amount of light emerging from an output end of the optical fiber is monitored (active alignment), it is impossible to detect a slight difference in offset amount. For this reason, in order to set the offset amount within the suitable range, it is necessary to precisely position a light emitting portion of the surface-emitting laser and an input end of the optical fiber.

SUMMARY OF THE INVENTION

The present invention precisely positions a light emitting portion of a light emitting element and an input end of an optical fiber, even when a light emitting surface of the used light emitting element is parallel to a substrate surface in an optical transmission device in which the light emitting element and the optical fiber are coupled.

In order to address the above problems, the present invention provides an optical-fiber supporting member that is coupled to a light emitting element so as to constitute an optical transmission device. Features (1)–(11) of the invention are discussed below.

(1) An optical-transmission light emitting portion to output light that enters an optical fiber, and a reference-light emitting portion to output reference light that does not enter the optical fiber, are formed on the same surface in the light emitting element to be coupled.

(2) The optical-fiber supporting member includes a cylindrical through hole in which an end portion of the optical fiber is inserted, and a photodetector to detect light from the reference-light emitting portion. The photodetector is disposed on a surface opposing the surface of the light emitting element, and the through hole extends perpendicularly to the surface.

(3) The positional relationship between the center of the cross-section of the through hole and the reference point of the photodetector is determined corresponding to the positional relationship between the optical-transmission light emitting portion and the reference-light emitting portion of the light emitting element.

(4) An exemplary optical-fiber supporting member of the present invention arranges the through hole and the photodetector so that the center of the cross-section of the through hole and the optical axis of the optical-transmission light emitting portion are offset by a predetermined amount when the reference point of the photodetector and the optical axis of the reference-light emitting portion are aligned.

(5) An exemplary optical-fiber supporting member of the present invention arranges the through hole and the photodetector so that the center of the cross-section of the through hole and the optical axis of the optical-transmission light emitting portion are aligned when the reference point of the photodetector and the optical axis of the reference-light emitting portion are aligned.

The present invention also provides an optical transmission device in which light is transmitted with a transmission characteristic similar to that of a single-mode optical fiber by causing the light from a light emitting element having a light-emitting surface parallel to a substrate surface to enter a multimode optical fiber so as to be offset from the optical axis, and which has the following features (6) to (9):

(6) The light emitting element and an optical-fiber supporting member are coupled by a coupling member.

(7) The light emitting element is the light emitting element specified in feature (1) above.

(8) The optical-fiber supporting member includes features (2) to (4) above.

(9) An end portion of the multimode optical fiber is inserted into a through hole of the optical-fiber supporting member.

The present invention also provides an optical transmission device in which light is transmitted by causing the light from a light emitting element having a light-emitting surface parallel to a substrate surface to enter an optical fiber, and which has the following features (10) to (13):

(10) The light emitting element and an optical-fiber supporting member are coupled by a coupling member.

(11) The light emitting element is the light emitting element specified in feature (1) above.

(12) The optical-fiber supporting member includes features (2), (3), and (5) above.

(13) An end portion of a single-mode optical fiber is inserted into a through hole of the optical-fiber supporting member.

An exemplary optical transmission device of the present invention is provided in which the light emitting element specified in features (7) and (11) above has a plurality of light emitting portions simultaneously formed on the same surface, at least one of the plurality of light emitting portions serves as an optical-transmission light emitting portion, and at least one of the plurality of light emitting portions serves as a reference-light emitting portion.

Embodiments of the present invention will be described below with reference to the drawings.

DETAILED DESCRIPTION OF PREFERRED EMBODIMENTS

Embodiments of the present invention will be described below.

Figure 1:
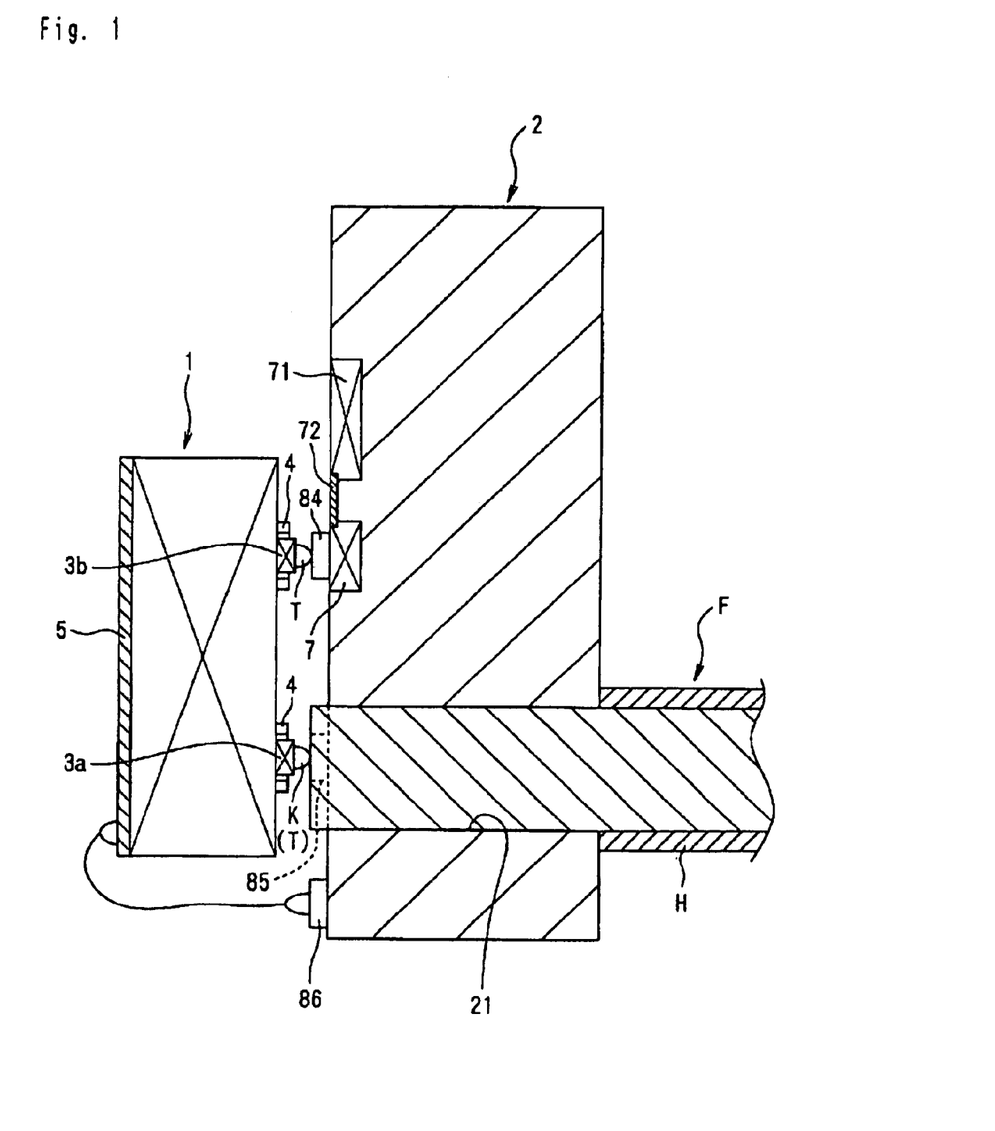
FIG. 1 is a sectional view showing the general configuration of an optical transmission device corresponding to a first embodiment of the present invention, and corresponds to a sectional view taken along plane A—A in FIG. 2(a) and a sectional view taken along plane B—B in FIG. 2(b)

FIG. 1 is a sectional view showing the general configuration of an optical transmission device corresponding to a first embodiment of the present invention. FIG. 1 corresponds to a sectional view taken along plane A—A in FIG. 2(a), and a sectional view taken along plane B—B in FIG. 2(b), which will be described below.

Figure 2:
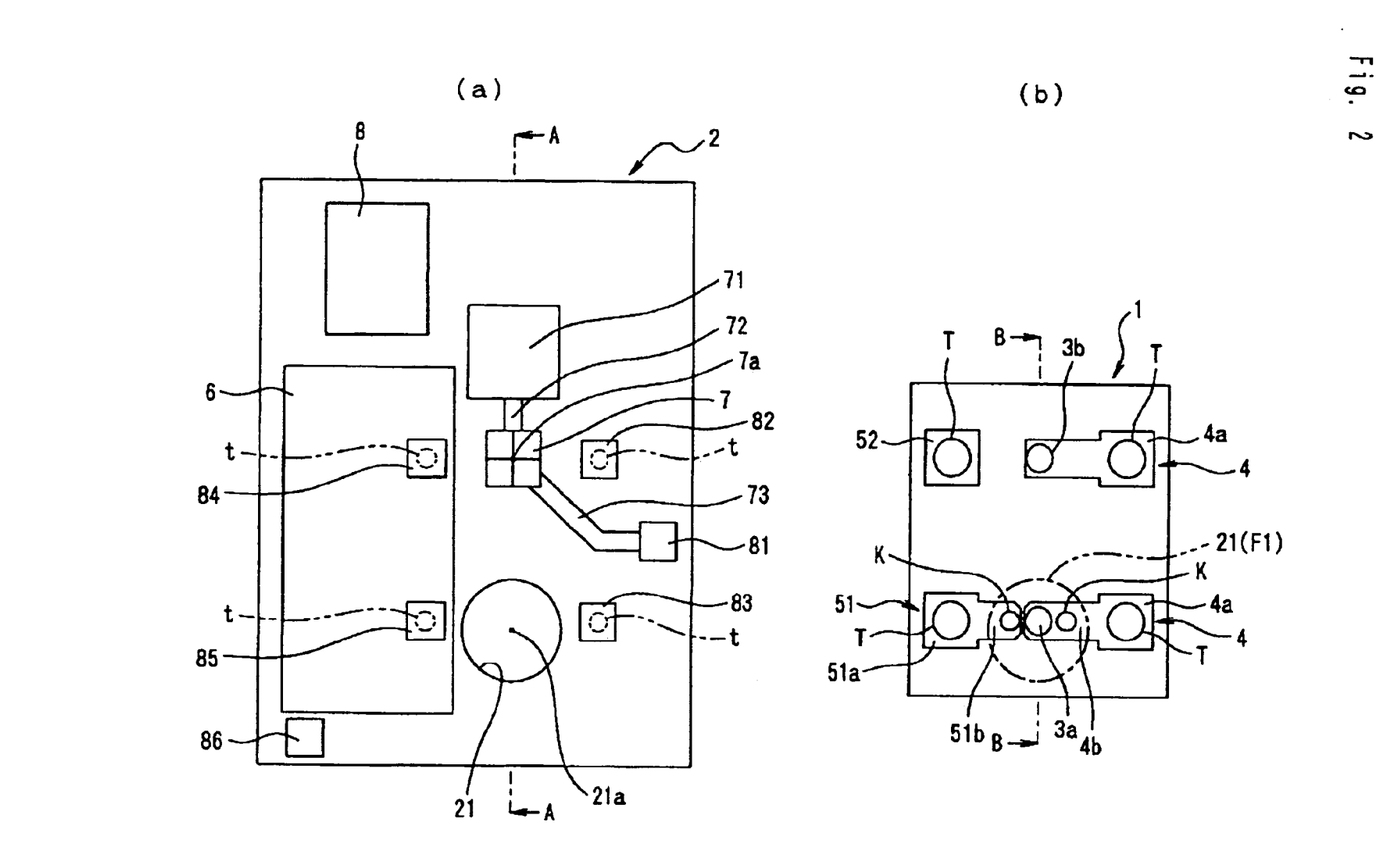
FIG. 2(a) is a front view of an optical-fiber supporting member.
FIG. 2(b) is a front view of a surface-emitting laser.

The optical transmission device includes a surface-emitting laser (light emitting element) 1, an optical fiber F, an optical-fiber supporting member 2 to support an end portion of the optical fiber F, and conductive protuberances (coupling members) T to couple the surface-emitting laser 1 and the optical-fiber supporting member 2. FIG. 2(a) is a front view of the optical-fiber supporting member 2, and FIG. 2(b) is a front view of the surface-emitting laser 1. The surface-emitting laser 1 and the optical-fiber supporting member 2 are placed with their front surfaces opposed thereto, and are coupled by the conductive protuberances T.

The surface-emitting laser 1 has two light-emitting portions (apertures) 3a and 3b simultaneously formed on the same surface (front surface). The surface-emitting laser 1 is obtained by a general method that produces a surface-emitting laser array. That is, the surface-emitting laser 1 is obtained by obtaining surface-emitting lasers having multiple light emitting portions by forming the light emitting portions at predetermined positions on a layered product placed on the entire surface of a semiconductor substrate, and then cutting the surface-emitting lasers. The surface-emitting laser 1 is cut into a rectangular shape, and two light emitting portions 3a and 3b are placed at the positions at an equal distance from the center along the bisector of the short side thereof.

The light emitting portions 3a and 3b are provided with electrodes 4, respectively. Dummy electrodes 51 and 52 are formed at positions symmetrical to pad portions 4a of the electrodes 4 with respect to the light emitting portions 3a and 3b. The dummy electrode 51 formed by the side of the light emitting portion 3a includes a portion 51a having the same shape as that of the pad portion 4a, and a portion 51b extending from the portion 51a toward the light emitting portion 3a. The dummy electrode 52 formed by the side of the light emitting portion 3b has the same shape as that of the pad portion 4a. A common electrode 5 is formed on the back side of the surface-emitting laser 1 (the back surface of the substrate).

The optical-fiber supporting member 2 is made of single-crystal silicon and has a rectangular parallelepiped shape. A laser-driving circuit 6, a photodiode (photodetector) 7, an amplifier 71 for the photodiode 7, a measuring circuit 8, and electrodes 81 to 86 are formed on one surface (front surface) of the rectangular parallelepiped.

Figure 3:
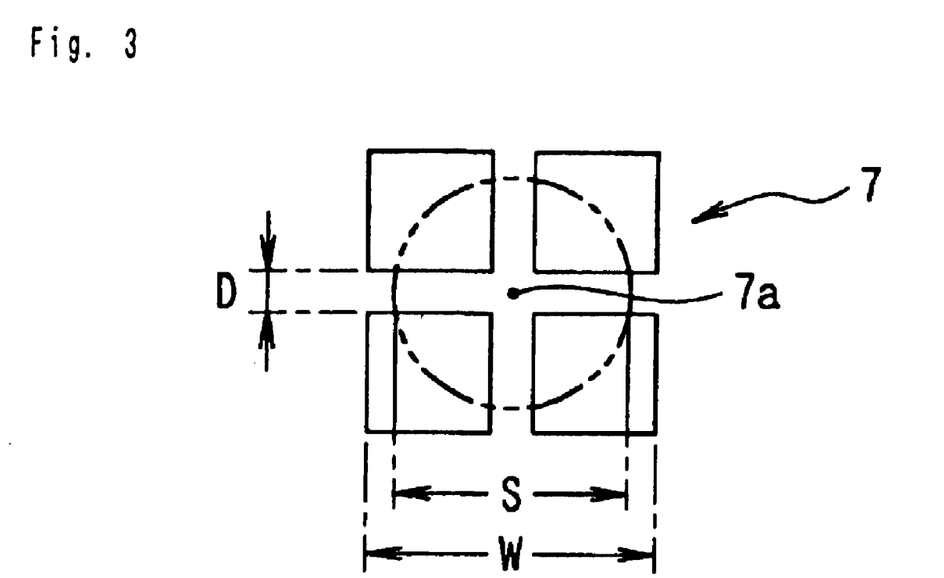
FIG. 3 is a front view of a photodiode formed in the optical-fiber supporting member.

As shown in FIG. 3, the photodiode 7 is a four-divided photodiode in which four light-receiving regions are arranged in the form of a 2×2 grid with a predetermined space therebetween. The dimension D of the space and the total size W of the photodiode 7 are set in accordance with the spot diameter S of light to be received. For example, when the spot diameter S on the receiving surface of the photodiode 7 is 24 mm, W and D are set at 30 mm and 5 mm, respectively.

The measuring circuit 8 is disposed adjacent to the amplifier 71 and the laser-driving circuit 6, receives an output signal from the amplifier 71 (the amount of light received by the four receiving regions of the photodiode 7), performs a predetermined measuring operation, and outputs the measurement result to a control circuit to perform positioning.

The optical-fiber supporting member 2 also has a cylindrical through hole 21 extending perpendicularly to the front surface of the rectangular parallelepiped.

Figure 4:
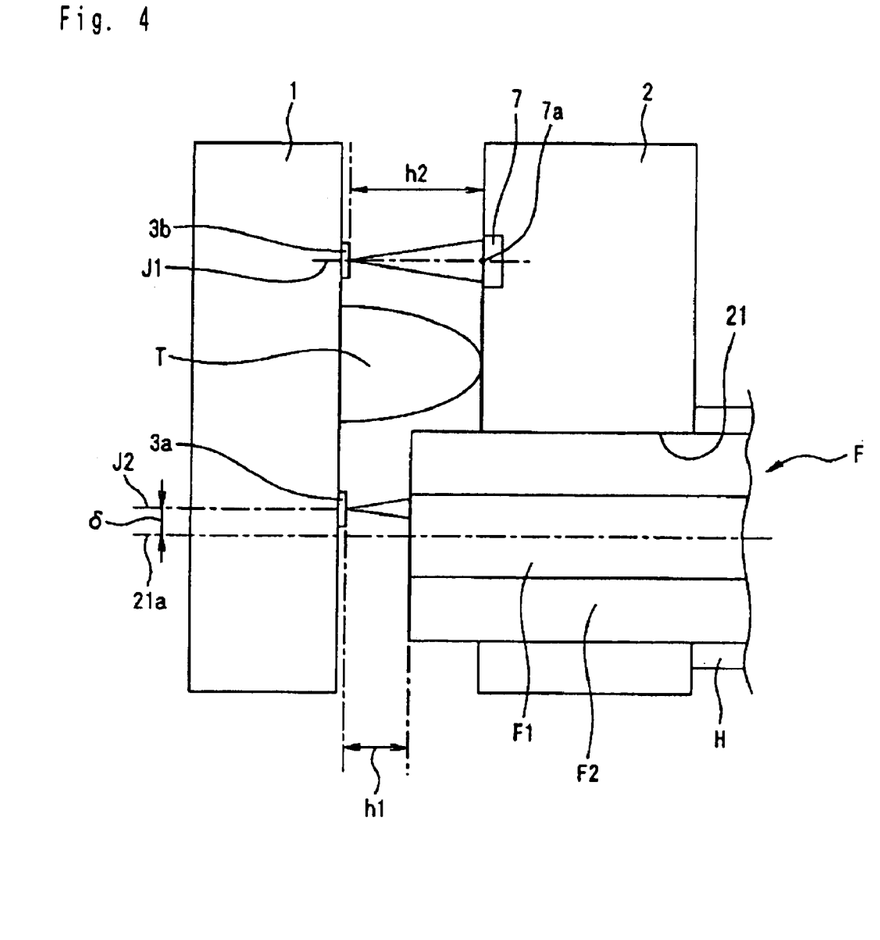
FIG. 4 is a plan view showing the positional relationship among the surface-emitting laser, the optical fiber-supporting member, and an optical fiber in the optical transmission device of the first embodiment.

As shown in FIG. 4, the through hole 21 and the photodiode 7 are placed in accordance with the arrangement of the two light emitting portions 3a and 3b of the surface-emitting laser 1 so that a center 21a of the circular section of the through hole 21 and the optical axis J2 of the light emitting portion 3a for optical transmission are offset by a predetermined amount d when a center point (reference point) 7a of the photodiode 7 and the optical axis J1 of the light emitting portion 3b for reference light are aligned with each other.

Accordingly, the center 21a of the circular section of the through hole 21 and the optical axis J2 of the optical-transmission light emitting portion 3a are placed so as to be only offset by the predetermined amount d by aligning the center point 7a of the photodiode 7 and the optical axis J1 of the reference-light emitting portion 3b when coupling the surface-emitting laser 1 and the optical-fiber supporting member 2. For this reason, the optical fiber F inserted in the through hole 21 is placed so that the center of a core F1 is offset by the predetermined amount d from the optical axis J2 of the optical-transmission light-emitting portion 3a.

Since a predetermined difference necessary to insert the optical fiber in the through hole 21 is formed between the diameter of the circular section of the through hole 21 and the diameter of a cladding F2 of the optical fiber, the center of the core F1 and the center of the circular section of the through hole 21 are not accurately aligned with each other. However, the offset amount d can be controlled by the order of submicrons by forming the through hole 21 by a photolithographic process and an etching process.

In the optical-fiber supporting member 2, the electrodes 82 to 85 are also placed on both sides of the through hole 21 and the photodiode 7. The electrodes 82 and 83 are dummy electrodes, and the electrodes 84 and 85 are output pads for the laser-driving circuit 6.

The dummy electrode 82 disposed by the side of the photodiode 7 is placed at a position corresponding to the dummy electrode 52 by the side of the light emitting portion 3b of the surface-emitting laser 1. The driving-circuit electrode 84 disposed by the side of the photodiode 7 is placed at a position corresponding to the pad portion 4a by the side of the light emitting portion 3b of the surface-emitting laser 1. The dummy electrode 83 disposed by the side of the through hole 21 is placed at a position corresponding to the pad portion 51a of the dummy electrode 51 by the side of the light emitting portion 3a of the surface-emitting laser 1. The driving-circuit electrode 85 disposed by the side of the through hole 21 is placed at a position corresponding to the pad portion 4a by the side of the light emitting portion 3a of the surface-emitting laser 1.

The photodiode 7 and the amplifier 71 are connected by a wire 72. The electrode 81 is provided for the photodiode 7, and is connected to the photodiode 7 by a wire 73. This electrode 81 is placed outside of the electrodes 82 and 83. The electrode 86 disposed on the lower side of the laser-driving circuit 6 is connected to the electrode 5 on the back side of the surface-emitting laser 1 by wire bonding.

The optical-fiber supporting member 2 is formed by forming the laser-driving circuit 6, the photodiode 7, the amplifier 71, and the measuring circuit 8 on the substrate made of single-crystal silicon in a monolithic manner by a known method, and then forming the through hole 21 at a predetermined position. The through hole 21 can be formed in the following manner.

First, recesses that are each shaped like a quadrangular pyramid are formed by etching at the positions on both surfaces of the substrate corresponding to the center of the cross-section of the through hole 21 and along the crystal plane of the single-crystal silicon. Next, one of the recesses is irradiated with laser light. Silicon existing between the vertexes of the quadrangular pyramids of the recesses is thereby removed, so that a narrow through hole is formed. Subsequently, the diameter of the narrow through hole is increased by further etching.

For example, the surface-emitting laser 1 and the optical-fiber supporting member 2 are coupled by the protuberances T in the following manner. First, protuberances T are formed on the pad portions 4a of the electrodes 4, the pad portion 51a of the dummy electrode 51, and the dummy electrode 52 serving as the connecting positions of the surface-emitting laser 1 by a method that conforms to wire bonding.

In this method, first, a metal wire made of gold or the like is passed through a capillary of a wire bonding device, and the leading end thereof is melted by an electric torch or the like, thereby forming a metal ball. Next, this capillary is moved down toward a metal surface on which a protuberance is to be formed, and the metal ball is heat-bonded to the metal surface. Then, the capillary is moved up, and the metal wire is cut at the base of the metal ball. Consequently, a metal protuberance is formed in the shape of a rivet on the metal surface.

As shown in FIG. 2(b), the optical-transmission light emitting portion 3a is disposed so as to face the through hole 21 of the optical-fiber supporting member 2, and an end portion of the optical fiber F is inserted in the through hole 21. As shown in FIG. 1, the optical fiber F is placed so that its leading end portion slightly protrudes from the front surface of the optical-fiber supporting member 2. For this reason, protuberances K to receive the leading end face of the optical fiber F on the side of the surface-emitting laser 1 are formed at positions inside of the through hole 21 on the optical-fiber supporting member 2 (inside the end face and outside the core in the optical fiber F) by the above-described method that conforms to wire bonding.

Herein, two protuberances K are formed on the electrode 4 of the optical-transmission light emitting portion 3a (a portion 4b offset from the pad portion 4a toward the light emitting portion 3a) and the dummy electrode 51 (the portion 51b on the side of the light emitting portion 3a). These protuberances K are formed with such a height that a predetermined distance is ensured between the end face of the optical fiber F and the light-emitting surface of the surface-emitting laser 1 when they abut the end face of the optical fiber F.

After the protuberances T and K are formed, first, the surface-emitting laser 1 and the supporting member 2 are roughly positioned by using the metal surface of the surface-emitting laser 1 having the protuberances T (the pad portions 4a and the like) and the electrodes 82 to 85 of the supporting member 2 by image recognition.

Next, the surface-emitting laser 1 is caused to emit light with the protuberances T and the electrodes 82 to 85 in slight contact with each other. The surface-emitting laser 1 and the optical-fiber supporting member 2 are precisely positioned by moving the surface-emitting laser 1 relative to the optical-fiber supporting member 2 on the basis of the result of measurement by the measuring circuit 8 so that the amounts of light received by the four light-receiving regions of the photodiode 7 are equal. That is, the center point 7a of the photodiode 7 and the optical axis J1 of the reference-light emitting portion 3b are aligned with each other. As a result, the center 21a of the circular section of the through hole 21 and the optical axis J2 of the optical-transmission light emitting portion 3a are placed offset by a predetermined amount d.

After positioning is completed, the protuberances T of the surface-emitting laser 1 and the electrodes 82 to 85 of the optical-fiber supporting member 2 are heated and ultrasonically welded in a state in which the protuberances T are pressed against the electrodes 82 to 85 by a predetermined force. The protuberances T and the electrodes 82 to 85 are thereby bonded to each other. As a result, the surface-emitting laser 1 and the optical-fiber supporting member 2 are coupled with a predetermined space therebetween.

The light emitting portions 3a and 3b of the surface-emitting laser 1 and the laser-driving circuit 6 of the optical-fiber supporting member 2 are electrically connected because of the bonding of the electrodes 84 and 85 of the optical-fiber supporting member 2 and the pad portions 4a of the surface-emitting laser 1 by the protuberances T. In FIG. 2(a), "t" represents the leading end faces of the protuberances T joined to the electrodes 82 to and 85.

After the surface-emitting laser 1 is fixed to the optical-fiber supporting member 2 in this way, a multimode optical fiber F having a cladding, which is exposed for a length slightly more than the length of the through hole 21 by removing a coating material H, is inserted into the through hole 21 of the optical-fiber supporting member 2, and an end face of the optical fiber F is brought into contact with the protuberances K. Thereby, the optical fiber F is mounted in the optical-fiber supporting member 2 in a state in which a predetermined distance is ensured between the end face of the optical fiber F and the light emitting portions 3a and 3b of the surface-emitting laser 1. The optical fiber F inserted in the through hole 21 is placed so that the center of the core F1 is offset from the optical axis J2 of the optical-transmission light emitting portion 3a by a predetermined amount d.

While the protuberance T to couple the surface-emitting laser 1 and the optical-fiber supporting member 2 on the side of the optical-transmission light emitting portion 3a is hidden by the protuberance K that abuts the end face of the optical fiber F, and is not shown in FIG. 1, it is denoted by "K(T)" in order to indicate that it exists at the position of the electrode 85 shown by broken lines.

Therefore, in the optical transmission device of this embodiment, since the through hole 21 and the photodiode 7 of the optical-fiber supporting member 2 are arranged as described above, the optical-transmission light emitting portion 3a of the surface-emitting laser 1 and the input end of the optical fiber F are positioned with high precision. Consequently, it is possible to set the predetermined amount d within a proper range, and to permit offset launch with a wider transmission band and with less coupling loss. That is, since light can be transmitted with a transmission characteristic similar to that of a single-mode optical fiber by the optical transmission device using the surface-emitting laser and the multimode optical fiber, long-distance and high-speed optical transmission is possible.

The positional relationship among the surface-emitting laser 1, the optical-fiber supporting member 2, and the optical fiber F are described with reference to FIG. 4. The distance h1 between the optical-transmission light emitting portion 3a and the end face of the optical fiber F is determined so that the laser spot diameter on the end face of the optical fiber F is less than or equal to the half of the core diameter. The distance h2 between the reference-light emitting portion 3b and the receiving surface of the photodiode 7 is determined so that the spot diameter on the receiving surface of the photodiode 7 is not excessively small.

In a specific example in which the wavelength of the surface-emitting laser 1 is 850 nm, the radiation angle thereof is 10° (full width at half maximum), and the core diameter of the optical fiber F is 50 $\mu$m, the offset amount $\delta$ is 13 $\mu$m to 17 $\mu$m (0.5 to 0.7 times of the core radius which is a proper offset amount), the distance h1 is 40 $\mu$m or less (the spot diameter is 12 $\mu$m or less), and the distance h2 is 80 $\mu$m (the spot diameter is 24 $\mu$m).

Further, in the optical transmission device of this embodiment, the amount of light emerging from the optical-transmission light emitting portion 3a can be monitored by detecting the light emerging from the reference-light emitting portion 3b by the photodiode 7 during optical transmission. Since the output characteristics of the two light emitting portions 3a and 3b simultaneously formed on the same plane are the same, the amount of light emerging from the optical-transmission light emitting portion 3a can be precisely monitored by detecting the emergent light from the reference-light emitting portion 3b.

Figure 5:
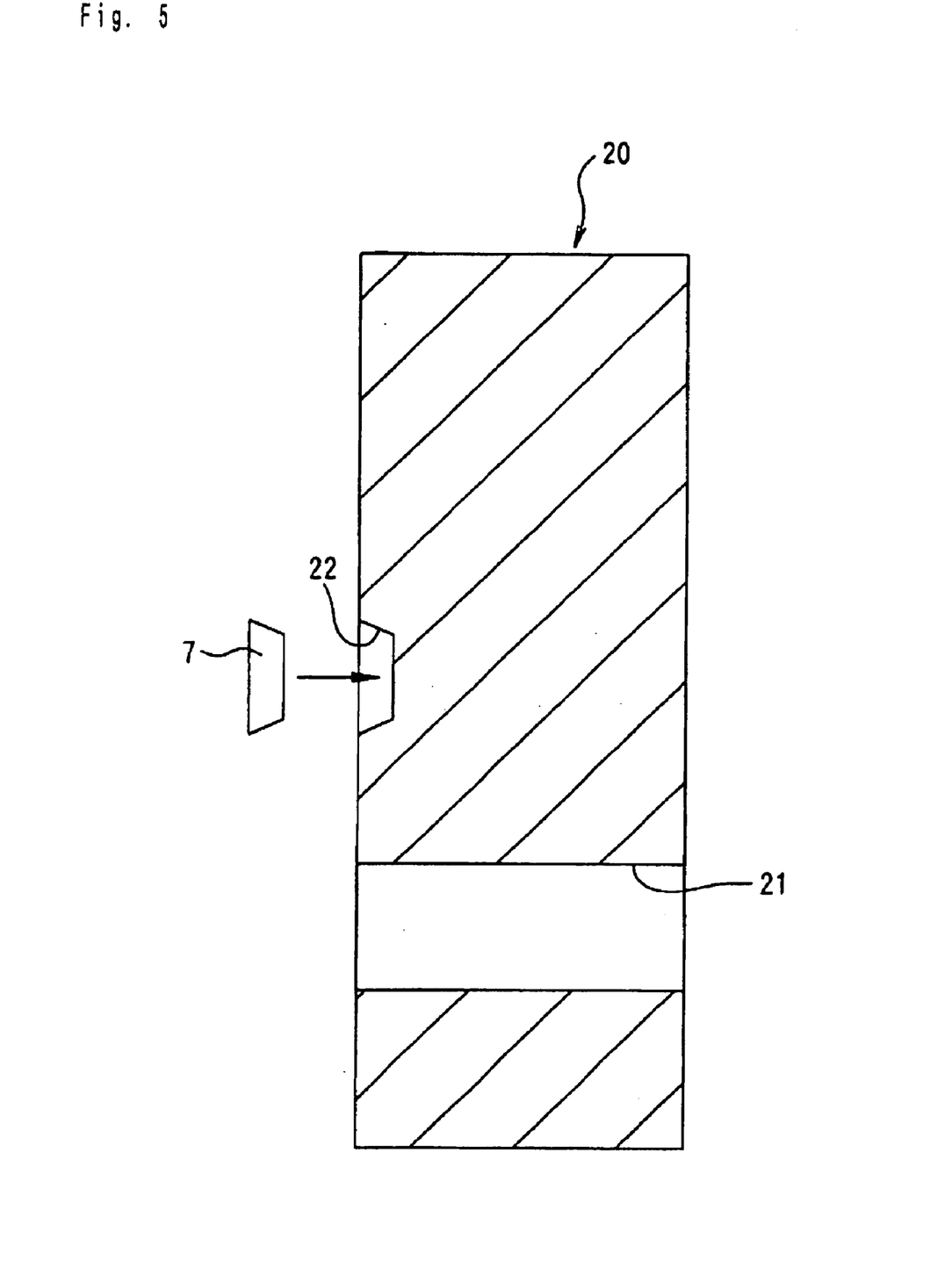
FIG. 5 is a sectional view showing a modification of an optical-fiber supporting member.

While the optical-fiber supporting member 2 made of silicon is used in the above embodiment, an optical-fiber supporting member 20 shown in FIG. 5 may be used. This optical-fiber supporting member 20 has a through hole 21 that is similar to that of the optical-fiber supporting member 2 shown in FIG. 1, and also has a recess 22 at a position on one face (front face) of a rectangular parallelepiped where a photodiode 7 is placed.

The optical-fiber supporting member 20 is obtained by making a rectangular parallelepiped, which has the through hole 21 and the recess 22 shown in FIG. 5, of glass, ceramics, or the like. The recess 22 is formed by a photo-lithographic process and an etching process when the optical-fiber supporting member 20 is made of glass, and by high-precision machining when the optical-fiber supporting member 20 is made of ceramics. On the other hand, a laser-driving circuit 6, a photodiode 7, an amplifier 71, and a measuring circuit 8 are produced by a known method.

Next, after the photodiode 7 is fitted in the recess 22 of the optical-fiber supporting member 20, the laser-driving circuit 6, the amplifier 71, and the measuring circuit 8 are then fixed to the optical-fiber supporting member 20 in the same layout as in FIG. 2(a) by flip chip bonding or wire bonding. Next, wires 72 and 73 and electrodes 81 to 86 are formed. The optical-fiber supporting member 20 in this state is coupled to a surface-emitting laser 1 by the same method as in the above embodiment.

A method described in U.S. Pat. No. 5,904,545 may be adopted as a method for fitting the photodiode 7 in the recess 22. That is, side faces of the photodiode 7 are shaped like a trapezoid that is smaller in size on the back side, and side faces of the recess 22 are also shaped like a trapezoid corresponding thereto. The optical-fiber supporting member 20 is placed with its surface having the recess 22 facing up, and a slurry in which the photodiode 7 is mixed in a predetermined fluid is made to flow thereon.

The photodiode 7 is thereby easily fitted into the recess 22. In this method, other elements can also be properly fitted into predetermined corresponding positions by forming the elements with different external dimensions, forming recesses for the elements in the optical-fiber supporting member 20; and making the elements flow in decreasing order of size.

Figure 6:
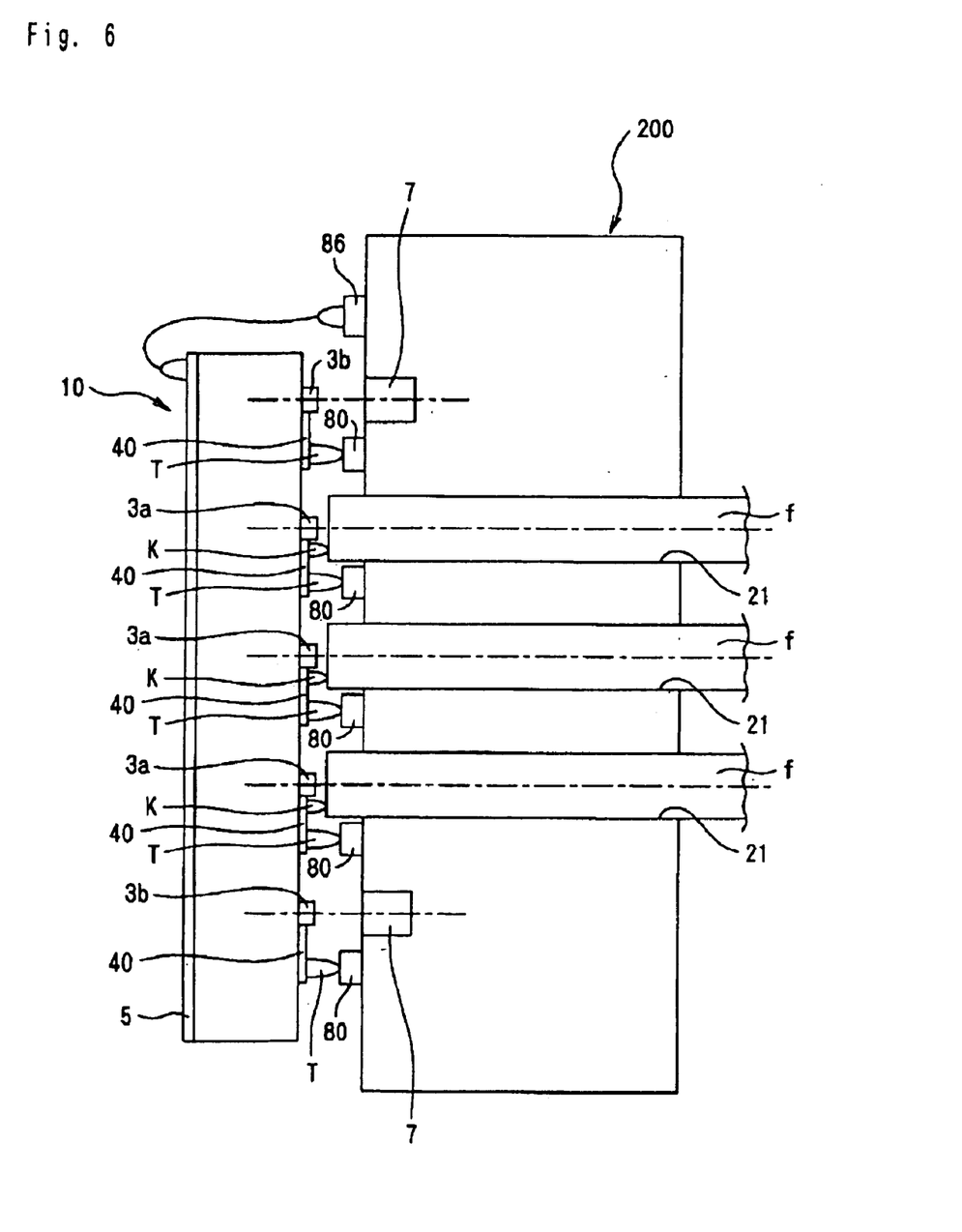
FIG. 6 is a plan view of an optical transmission device corresponding to a second embodiment of the present invention.

FIG. 6 is a schematic of an optical transmission device corresponding to a second embodiment of the present invention.

This embodiment is different from the first embodiment in that it uses a surface-emitting laser 10 having five light emitting portions. Two light emitting portions at both ends serve as reference-light emitting portions 3b, and the other three light emitting portions serve as transmission light emitting portions 3a. Three optical fibers f are used corresponding to the three transmission light emitting portions 3a. These optical fibers f are single-mode optical fibers.

An optical-fiber supporting member 200 has three through holes 21 corresponding to the optical fibers f, and two photodiodes (photodetectors) 7 corresponding to the two reference-light emitting portions 3b. The through holes 21 and the photodiodes 7 are arranged so that the centers of the circular sections of the through holes 21 and the optical axes of the optical-transmission light emitting portions 3a are aligned when the centers (reference points) of the two photodiodes 7 and the optical axes of the reference-light emitting portions 3b are aligned with each other.

Reference numeral 80 in FIG. 6 denotes electrodes or dummy electrodes corresponding to the electrodes 82 to 85 in the first embodiment, and reference numeral 40 denotes electrodes or dummy electrodes corresponding to the electrodes 4 and the dummy electrodes 51 and 52 in the first embodiment. The optical-fiber supporting member 200 also has an amplifier 71, a driving circuit 6, a measuring circuit 8, and the like in a manner similar to that in the first embodiment.

After protuberances T and K are formed on the electrodes (and dummy electrodes) 40 of the optical-fiber supporting member 200 in a manner similar to that in the first embodiment, the surface-emitting laser 1 is caused to emit light after rough positioning using image recognition in a manner similar to that in the first embodiment, and the surface-emitting laser 10 and the optical-fiber supporting member 200 are precisely positioned based on the result of measurement by the measuring circuit 8 so that the amounts of light received by four light-receiving regions of each photodiode 7 are equal. That is, the center points of the photodiodes 7 and the optical axes of the reference-light emitting portions 3b are aligned with each other. As a result, the center of the circular section of each through hole 21 and the optical axis of the corresponding optical-transmission light emitting portion 3a are aligned with each other.

When positioning is completed, the protuberances T of the surface-emitting laser 10 and the electrodes (and dummy electrodes) 80 of the optical-fiber supporting member 200 are joined by heating and ultrasonic welding in a state in which the protuberances T are pressed against the electrodes (and dummy electrodes) 80 by a predetermined force. As a result, the surface-emitting laser 10 and the optical-fiber supporting member 200 are coupled with a predetermined space therebetween.

After the surface-emitting laser 10 is fixed to the optical-fiber supporting member 200 in this way, single-mode optical fibers f each having a cladding, which is exposed for a length slightly more than the length of the through hole 21 by removing a coating material, are inserted into the through holes 21 so that end faces of the optical fibers f abut the protuberances K.

The optical fibers fare thereby mounted in the optical-fiber supporting member 200 in a state in which a predetermined distance is ensured between the end faces of the optical fibers f and the light emitting portions 3a and 3b of the surface-emitting laser 10. The optical fibers f inserted in the through holes 21 are placed so that the core centers are aligned with the optical axes of the optical-transmission light emitting portions 3a.

As described above, in the optical transmission device of the second embodiment, since the through holes 21 and the photodiodes 7 of the optical-fiber supporting member 200 are arranged in the above-described layout, the optical-transmission light emitting portions 3a of the surface-emitting laser 10 and the input ends of the optical fibers f are precisely positioned. In particular, since the optical-fiber supporting member 200 has two photodiodes 7 in the second embodiment, positioning in the rotating direction is possible. This permits high-precision positioning when the light emitting element has a plurality of optical-transmission light emitting portions.

Even when the light emitting element has one optical-transmission light emitting portion as in the first embodiment, more precise positioning is made possible by providing the light emitting element with a plurality of reference-light emitting portions and correspondingly providing the optical-fiber supporting member with a plurality of photodetectors, as in the second embodiment.

Since more precise positioning is possible in the optical transmission device having a plurality of pairs of reference-light emitting portions and photodetectors in this way, a single-mode optical fiber having a small core diameter and a surface-emitting laser can be optically coupled without a lens in the optical transmission device. This provides an optical device that is capable of long-distance and high-speed optical transmission.

As described above, in the optical-fiber supporting member of the present invention, since the positional relationship between the center of the cross-section of the through hole and the reference point of the photodetector is determined corresponding to the positional relationship between the optical-transmission light emitting portion and the reference-light emitting portion of the light emitting element to be coupled thereto, the optical-transmission light emitting portion of the light emitting element and the section of the through hole can be precisely positioned when the optical-fiber supporting member is coupled to the light emitting element so as to constitute the optical transmission device.

Accordingly, in the optical transmission device in which the light emitting element and the optical fiber are coupled, even when the light emitting element that has a light-emitting surface parallel to a substrate surface is used, the optical-transmission light emitting portion of the light emitting element and the input end of the optical fiber inserted in the through hole can be positioned with high precision.

As a result, since a single-mode optical fiber having a small core diameter and a surface-emitting laser can be optically coupled without a lens, and the offset launch of the surface-emitting laser with respect to a multimode optical fiber can be precisely performed by using the optical-fiber supporting member of the present invention, an optical transmission device is provided in which the surface-emitting laser and the optical fiber are coupled and which can achieve long-distance and high-speed optical transmission.

What is claimed is:

1. An optical-fiber supporting member coupled to a light emitting element so as to constitute an optical transmission device, wherein an optical-transmission light emitting portion for outputting light that enters an optical fiber, and a reference-light emitting portion for outputting reference light that does not enter said optical fiber are formed on a same side of said light emitting element, said optical-fiber supporting member includes a through hole in which an end portion of said optical fiber is inserted, and a photodetector for detecting light from said reference-light emitting portion, said photodetector is disposed on a side opposing said side of said light emitting element, said through hole extends perpendicularly to said side, a positional relationship between a center of a cross-section of said through hole and a reference point of said photodetector is determined corresponding to a positional relationship between said optical-transmission light emitting portion and said reference-light emitting portion of said light emitting element, and an optical axis of the optical-transmission light emitting portion for outputting light is aligned with an axis of the through hole within an offset by a predetermined amount, the axis of the through hole passing the center of the through hole.

2. An optical-fiber supporting member according to claim 1, wherein said through hole and said photodetector are arranged so that the center of the cross-section of said through hole and the optical axis of said optical-transmission light emitting portion are offset by the predetermined amount when the reference point of said photodetector and the optical axis of said reference-light emitting portion are aligned.

3. An optical-fiber supporting member according to claim 1, wherein said through hole and said photodetector are arranged so that the center of the cross-section of said through hole and the optical axis of said optical-transmission light emitting portion are aligned when the reference point of said photodetector and the optical axis of said reference-light emitting portion are aligned.

4. An optical transmission device for transmitting light with a transmission characteristic similar to that of a single-mode optical fiber by causing the light from a light emitting element having a light-emitting side parallel to a substrate surface to enter a multimode optical fiber so as to be offset from the optical axis, wherein said light emitting element, in which an optical-transmission light emitting portion for outputting light that enters said optical fiber, and a reference-light emitting portion for outputting reference light that does not enter said optical fiber are formed on the same side, and an optical-fiber supporting member according to claim 2 are coupled by a coupling member, and an end portion of said multimode optical fiber is inserted into said through hole of said optical-fiber supporting member.

5. An optical transmission device for transmitting light by causing light from a light emitting element having a light-emitting side parallel to a substrate side to enter an optical fiber, wherein said light emitting element, in which an optical-transmission light emitting portion for outputting light that enters said optical fiber, and a reference-light emitting portion for outputting reference light that does not enter said optical fiber are formed on the same side, and an optical-fiber supporting member according to claim 3 are coupled by a coupling member, and an end portion of said single-mode optical fiber is inserted into said through hole of said optical-fiber supporting member.

6. An optical transmission device according to claim 4 or 5, wherein said light emitting element has a plurality of light emitting portions simultaneously formed on the same side, at least one of said plurality of light emitting portions serves as said optical-transmission light emitting portion, and at least one of said plurality of light emitting portions serves as said reference-light emitting portion.

* * * * *